(12) United States Patent
Kwon et al.

(10) Patent No.: US 8,981,492 B2
(45) Date of Patent: Mar. 17, 2015

(54) METHODS OF FORMING AN E-FUSE FOR AN INTEGRATED CIRCUIT PRODUCT AND THE RESULTING INTEGRATED CIRCUIT PRODUCT

(71) Applicant: GLOBALFOUNDRIES Inc., Grand Cayman (KY)

(72) Inventors: O Sung Kwon, Wappingers Falls, NY (US); Xiaoqiang Zhang, Rexford, NY (US); Anurag Mittal, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/928,060

(22) Filed: Jun. 26, 2013

(65) Prior Publication Data

US 2015/0001635 A1    Jan. 1, 2015

(51) Int. Cl.
*H01L 21/8234* (2006.01)
*H01L 21/02* (2006.01)
*H01L 21/306* (2006.01)
*H01L 23/525* (2006.01)
*H01L 21/768* (2006.01)
*H01L 27/06* (2006.01)

(52) U.S. Cl.
CPC ...... *H01L 21/76889* (2013.01); *H01L 23/5256* (2013.01); *H01L 27/0629* (2013.01)
USPC ........... 257/379; 257/529; 438/238; 438/601; 438/696

(58) Field of Classification Search
None
See application file for complete search history.

(56) References Cited

U.S. PATENT DOCUMENTS

| | | | | |
|---|---|---|---|---|
| 6,274,409 B1* | 8/2001 | Choi | | 438/128 |
| 7,501,345 B1* | 3/2009 | Basker et al. | | 438/682 |
| 2011/0189827 A1* | 8/2011 | Hsu et al. | | 438/238 |
| 2013/0082347 A1* | 4/2013 | Chen et al. | | 257/529 |

* cited by examiner

*Primary Examiner* — Kimberly Rizkallah
*Assistant Examiner* — Brian Turner
(74) *Attorney, Agent, or Firm* — Amerson Law Firm, PLLC (57) ABSTRACT

An integrated circuit product is disclosed that includes a resistor body and an e-fuse body positioned on a contact level dielectric material, wherein the resistor body and the e-fuse body are made of the same conductive material, a first plurality of conductive contact structures are coupled to the resistor body, conductive anode and cathode structures are conductively coupled to the e-fuse body, wherein the first plurality of conductive contact structures and the conductive anode and cathode structures are made of the same materials.

6 Claims, 9 Drawing Sheets

Figure 3J

METHODS OF FORMING AN E-FUSE FOR AN INTEGRATED CIRCUIT PRODUCT AND THE RESULTING INTEGRATED CIRCUIT PRODUCT

BACKGROUND OF THE INVENTION

1. Field of the Invention

Generally, the present disclosure relates to the manufacture of semiconductor devices, and, more specifically, to various methods of making an e-fuse for use on integrated circuit products and the resulting integrated circuit product.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, whether an NMOS or a PMOS device, is a planar device that typically includes a source region, a drain region, a channel region that is positioned between the source region and the drain region, and a gate structure positioned above the channel region. The gate structure is typically comprised of a very thin gate insulation layer and one or more conductive layers that act as a conductive gate electrode. In a field effect transistor, the conductivity of the channel region, i.e., the drive current capability of the conductive channel, is controlled by applying an appropriate voltage to the gate electrode.

For many early device technology generations, the gate structures of most transistor devices was made using silicon-based materials, such as a silicon dioxide and/or silicon oxynitride gate insulation layer, in combination with a polysilicon gate electrode. However, as the channel length of aggressively scaled transistor devices has become increasingly smaller, many newer generation transistor devices employ gate electrode structures comprised of a so-called high-k gate insulation layer (k value of 10 or greater) and a gate electrode structure comprised of one or more metal layers, i.e., high-k/metal gate structures (HK/MG). Transistor devices with such an HK/MG structure exhibit significantly enhanced operational characteristics as compared to the heretofore more commonly used silicon dioxide/polysilicon ($SiO_2$/poly) configurations.

One well-known processing method that has been used in recent years for forming a transistor with a high-k/metal gate structure is the so-called "gate last" or "replacement gate" technique. In general, the replacement gate process involves forming a basic transistor structure that includes a sacrificial or "dummy" gate insulation layer, a sacrificial or "dummy" gate electrode, sidewall spacers and source/drain regions in the substrate. The sacrificial gate insulation layer is typically made of silicon dioxide and the sacrificial gate electrode is typically made of polysilicon. After certain high-temperature process operations are performed, e.g., after the source/drain anneal process is performed to activate the implanted dopant materials and to repair any damage to the lattice structure of the substrate, the sacrificial gate electrode and the sacrificial gate insulation layer are removed to thereby define a gate cavity between the spacers where the "replacement gate," i.e., the high-k dielectric/metal gate structure, will be formed.

In modern integrated circuits, a very high number of individual circuit elements, such as field effect transistors in the form of CMOS, NMOS, PMOS elements, resistors, capacitors and the like, are formed on a single chip area. In addition to the large number of transistor elements, a plurality of passive circuit elements, such as capacitors, resistors and the like, are typically formed in integrated circuits that are used for a plurality of purposes, such as for decoupling.

Due to the reduced size of circuit elements, not only the performance of the individual transistor elements may be increased, but also their packing density may be improved, thereby providing the potential for incorporating increased functionality into a given chip area. For this reason, highly complex circuits have been developed which may include different types of circuits, such as analog circuits, digital circuits and the like, thereby providing entire systems on a single chip (SoC). Furthermore, in sophisticated micro-controller devices, an increasing amount of storage capacity may be provided on a chip with the CPU core, thereby also significantly enhancing the overall performance of modern computer devices.

For a variety of reasons, the various circuit portions may have significantly different performance capabilities, for instance with respect to useful lifetime, reliability and the like. For example, the operating speed of a digital circuit portion, such as a CPU core and the like, may depend on the configuration of the individual transistor elements and also on the characteristics and performance of the metallization system coupled to the CPU core. Consequently, the combination of the various circuit portions in a single semiconductor device may result in a significantly different behavior with respect to performance and reliability. Variations in the overall manufacturing process flow may also contribute to further variations in the performance capabilities between various circuit portions. For these reasons, in complex integrated circuits, frequently additional mechanisms are used so as to allow the circuit itself to adapt or change the performance of certain circuit portions to comply with the performance characteristics of other circuit portions. Such mechanisms are typically used after completing the manufacturing process and/or during use of the semiconductor device. For example, when certain critical circuit portions no longer comply with corresponding device performance criteria, adjustments may be made, such as re-adjusting an internal voltage supply, re-adjusting the overall circuit speed and the like, to correct such underperformance.

In computing, e-fuses are used as a means to allow for the dynamic, real-time reprogramming of computer chips. Speaking abstractly, computer logic is generally "etched" or "hard-coded" onto a silicon chip and cannot be changed after the chip has been manufactured. By utilizing an e-fuse, or a number of individual e-fuses, a chip manufacturer can change some aspects of the circuits on a chip. If a certain sub-system fails, or is taking too long to respond, or is consuming too much power, the chip can instantly change its behavior by blowing an e-fuse. Programming of an e-fuse is typically accomplished by forcing a large electrical current through the e-fuse. This high current is intended to break or rupture a portion of the e-fuse structure, which results in an "open" electrical path. In some applications, lasers are used to blow e-fuses. Fuses are frequently used in integrated circuits to program redundant elements or to replace identical defective elements. Further, e-fuses can be used to store die identification or other such information, or to adjust the speed of a circuit by adjusting the resistance of the current path. Device manufacturers are under constant pressure to produce integrated circuit products with increased performance and lower power consumption relative to previous device generations. This drive applies to the manufacture and use of e-fuses as well.

Figure 1A:
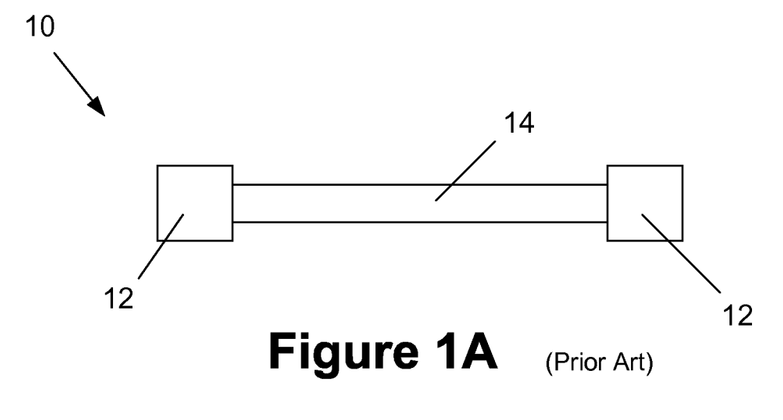
FIGS. 1A-1B depict various illustrative examples of prior art e-fuse devices.
Figure 1B:
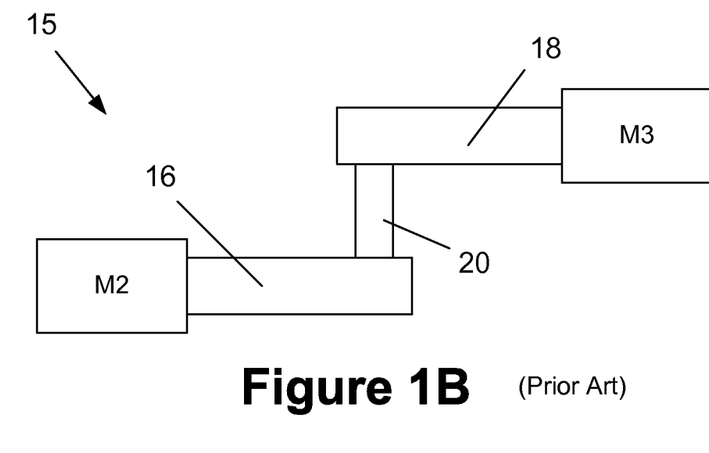

Prior art e-fuses come in various configurations. FIGS. 1A-1B depict illustrative examples of some forms of prior art e-fuses. FIG. 1A is a plan view of a very simple e-fuse 10 comprised of conductive lines or structures 12 having a reduced-size metal line 14 coupled to the conductive structures 12. The e-fuse 10 may sometimes be referred to as a "BEOL" type e-fuse, as it is typically made using the materials used in forming various metallization layers in so-called Back-End-Of-Line activities.

FIG. 1B is a cross-sectional view of another type of e-fuse 15 that extends between two illustrative metal layers, M2 and M3, formed on an integrated circuit product. In general, the e-fuse 15 is comprised of schematically depicted conductive lines 16, 18 that are formed in the metallization layers M2, M3, respectively. A reduced-size metal structure or via 20 is conductively coupled to the conductive lines 16, 18. The e-fuse 15 may sometimes be referred to as an "I" type e-fuse due to its cross-sectional configuration. In some very early device generations, e-fuses were comprised of structures that included polysilicon line-type features as part of the e-fuse. The polysilicon line-type features for the e-fuses were typically patterned at the same time as was the polysilicon gate electrodes for the various transistor devices. A metal silicide material was formed on top of the polysilicon lines used for the e-fuse.

All of the above-described e-fuses typically worked by passing a sufficient current though the e-fuse such that, due to resistance heating, some portion or component of the e-fuse ruptured, thereby creating an open electrical circuit. The polysilicon-based e-fuses were programmed by passing a current through the fuse to cause the metal silicide material to rupture due to electromigration. Some types of e-fuses, such as BEOL e-fuses, require a relatively high programming current, e.g., about 35 mA or higher. Such a high programming current is generally not desirable for e-fuses, as such a high programming current will require a relatively larger programming transistor, which means increased consumption of valuable space on the chip. Moreover, a higher programming current degrades the sensing margin for sensing circuits that are used to determine whether or not the e-fuse is programmed, i.e., blown.

Figure 2A:
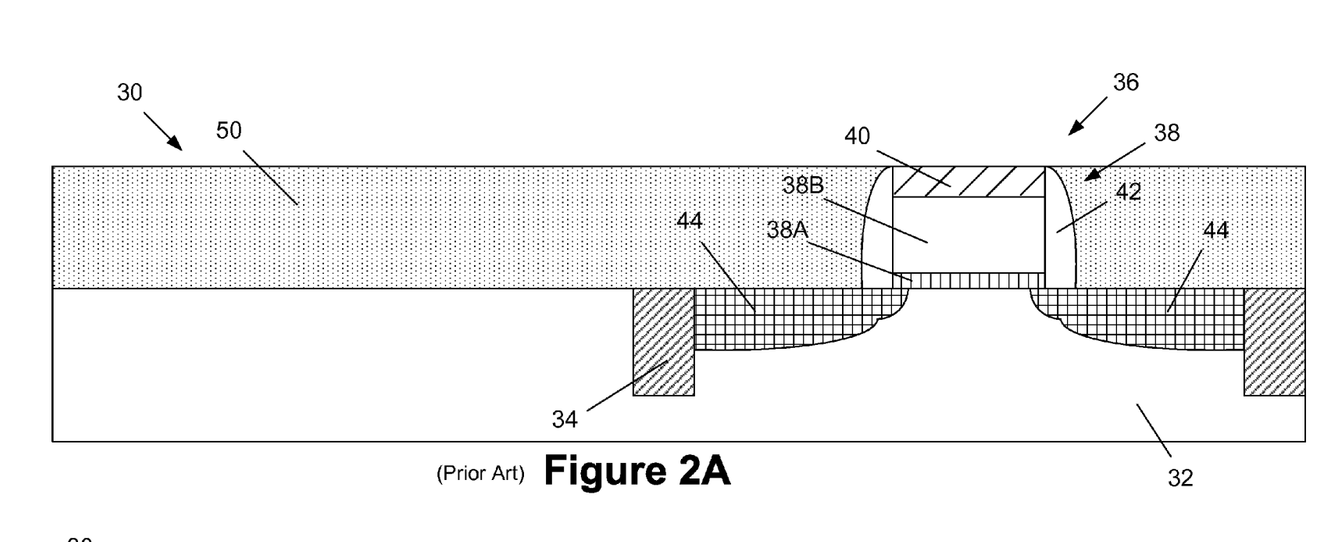
FIGS. 2A-2D depict one illustrative prior art technique used to form metal silicide based resistors on an integrated circuit product.

FIGS. 2A-2D depict one illustrative prior art technique used to form metal silicide based resistors on a prior art integrated circuit product 30. FIG. 2A is a cross-sectional view that schematically depicts the product at a point in fabrication wherein an illustrative transistor 36 has been formed in and above an active region defined in the substrate 32 by an illustrative isolation region 34. The transistor 36 is generally comprised of a gate structure 38 comprised of a gate insulation layer 38A and a conductive gate electrode layer 38B, sidewall spacers 42, a gate cap layer 40 and source/drain regions 44. Various other aspects of the transistor 36 are not depicted, e.g., doped well regions, halo implant regions, etc. Also depicted in FIG. 2A is a contact level dielectric material 50 that has been formed above the substrate 32. The contact level dielectric material 50 is intended to be representative in nature as it may be comprised of one or more layers of insulating material, e.g., silicon dioxide, silicon nitride, etc. The contact level dielectric material 50 may be formed by performing one or more known deposition processes, e.g., chemical vapor deposition (CVD). The product 30 is depicted at the point in fabrication wherein it is time to form conductive contacts to at least the source/drain regions 44 of the transistor 36.

Figure 2B:
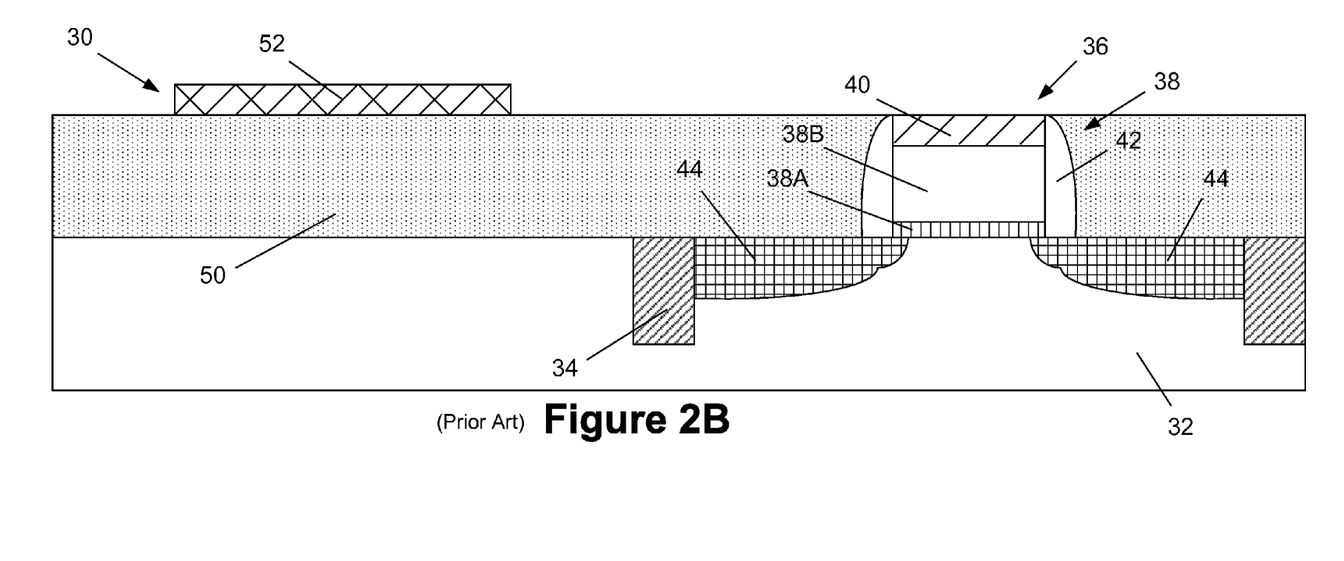

Next, as shown in FIG. 2B, a resistor body 52 is formed above the contact level dielectric material 50. In one embodiment, the resistor body 52 may be formed by depositing a layer of a metal silicide, e.g., tungsten silicide, and thereafter patterning the deposited metal silicide material using known photolithography and etching tools and techniques. The metal silicide material may be initially deposited by performing, for example, a physical vapor deposition (PVD) process. The resistor body 52 may be formed to any desired thickness and length.

Figure 2C:
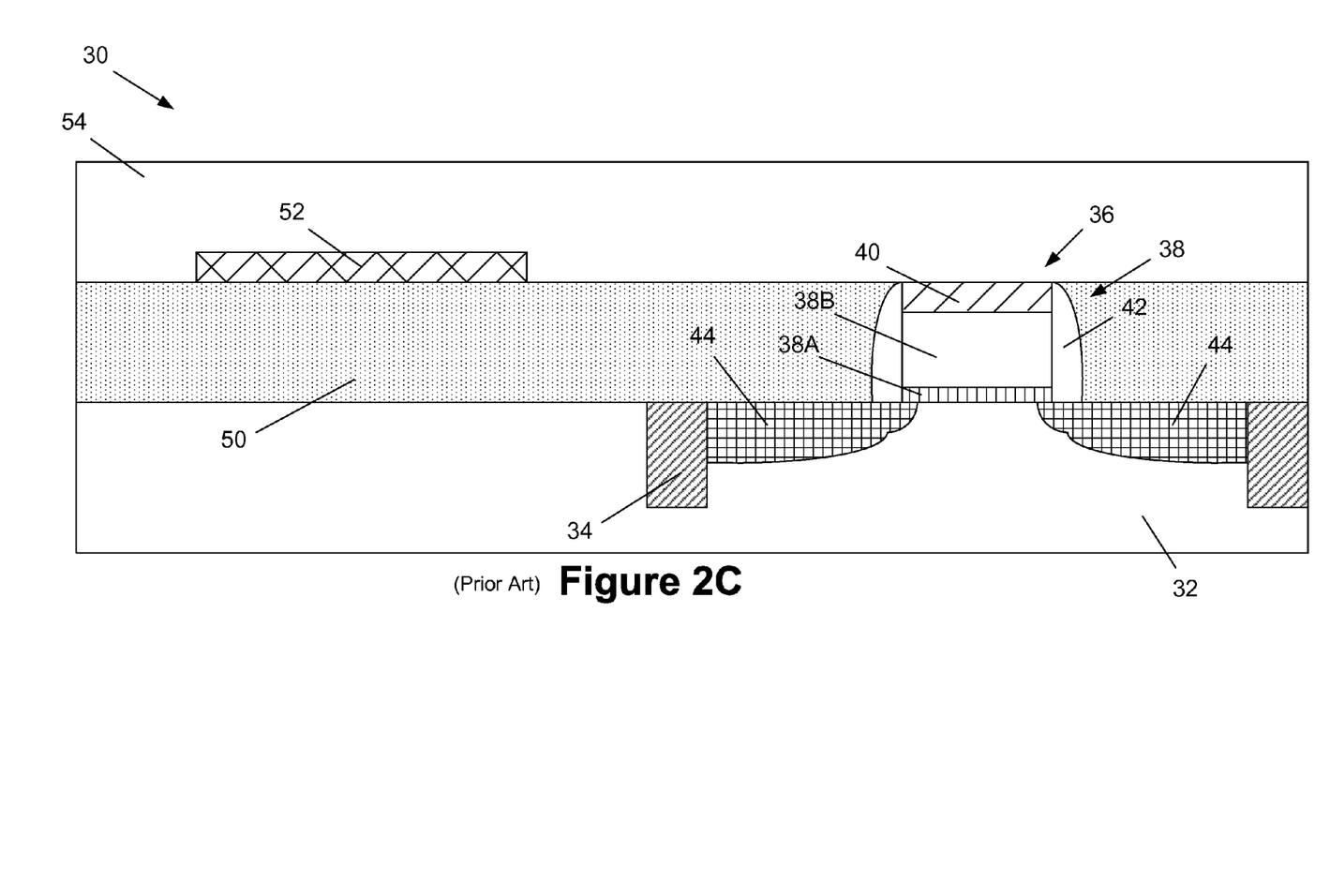

FIG. 2C depicts the product 30 after a layer of insulating material 54 is deposited above the product 30. The layer of insulating material 54 is intended to be representative in nature as it may be comprised of one or more layers of insulating material, e.g., silicon dioxide, silicon nitride, etc. The layer of insulating material 54 may be formed by performing one or more known deposition processes, e.g., CVD, and it may be formed to any desired thickness.

Figure 2D:
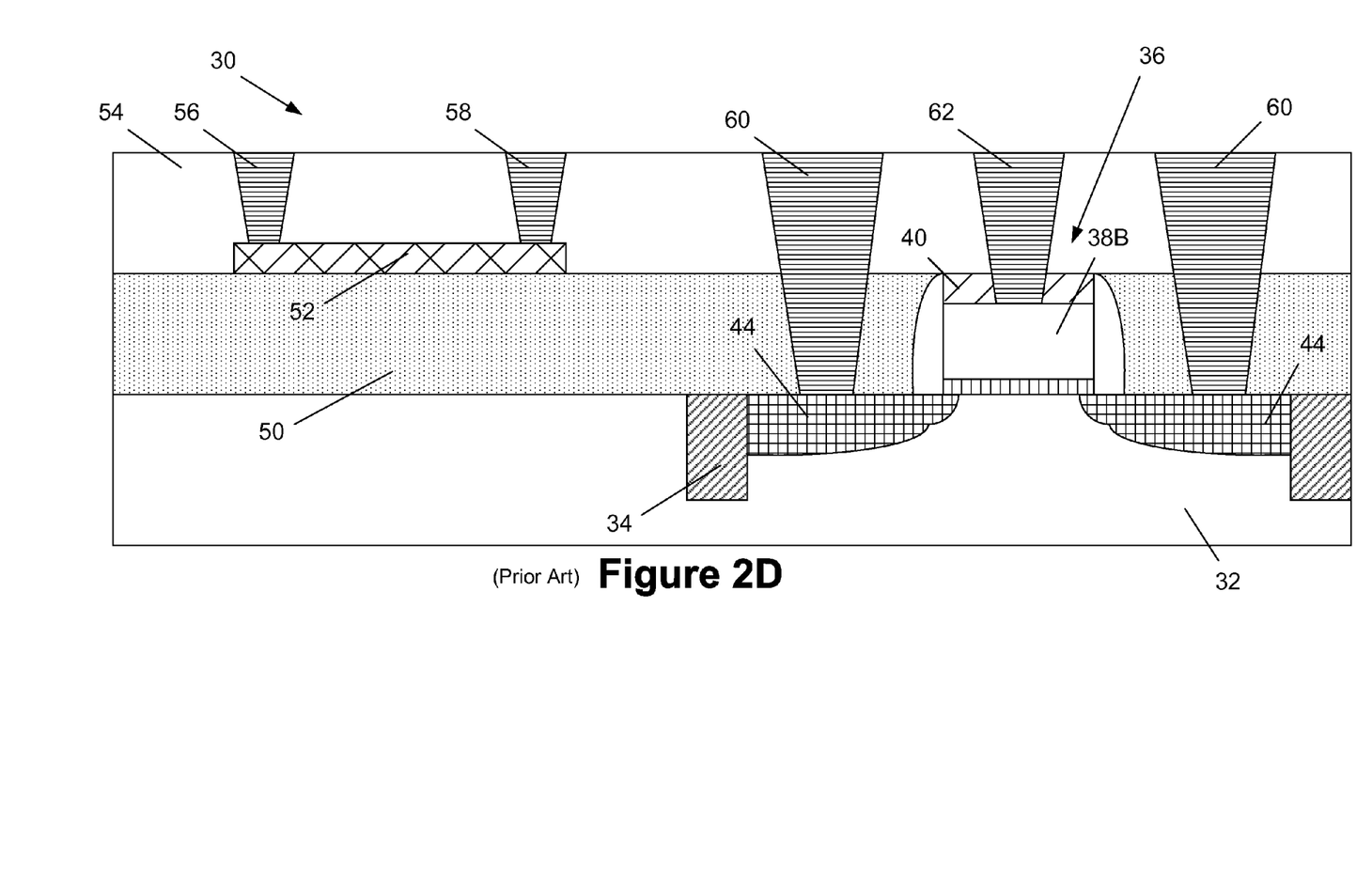

FIG. 2D depicts the device 30 after various conductive contact structures have been formed to establish electrical contacts to the source/drain regions 44 of the transistor 36 and to the gate electrode 38B of the transistor 36. More specifically, conductive contact structures 56 and 58 are formed so as to be conductively coupled to the resistor body 52, conductive contact structures 60 are formed so as to be conductively coupled to the source/drain regions 44 and a conductive contact structure 62 is formed so as to be conductively coupled to the gate electrode 38B of the transistor 36. Although simplistically depicted in FIG. 2D, the various conductive contact structures 56, 58, 60 and 62 may be formed at the same time or at different times in the process flow depending upon the particular application. Moreover, the conductive contact structures 56, 58, 60 and 62 shown in FIG. 2D are depicted as being formed of a single uniform material. In practice, the conductive contact structures 56, 58, 60 and 62 may be comprised of two or more conductive materials, e.g., a metal silicide region and a tungsten region coupled to the metal silicide region. The manner in which the conductive contact structures 56, 58, 60 and 62 are formed are well known to those skilled in the art. In practice, the conductive contact structures 56, 58 provide a conductive flow path for current that passes through the resistor body 52 to establish the desired resistance in the circuit that includes the resistor. Importantly, all or a portion of the conductive contact structures 56, 58 are formed at the same time as at least a portion of one of the conductive contact structures 60 and 62 is formed.

The present disclosure is directed to various methods of making a metal silicide e-fuse for use on integrated circuit products and the resulting integrated circuit product.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of making an e-fuse for use on integrated circuit products and the resulting integrated circuit product. One illustrative integrated circuit product disclosed herein includes a contact level dielectric material positioned above a semiconductor substrate, a resistor body positioned on the contact level dielectric material, an e-fuse body positioned on the contact level dielectric material, wherein the resistor body and the e-fuse body are made of the same material, at least one layer of insulating material positioned above the contact level dielectric material, the resistor body and the e-fuse body, a first plurality of conductive contact structures positioned in the layer of insulating material, wherein each of the first plurality of conductive contact structures are conductively coupled to the resistor body, a conductive anode structure positioned in the layer of insulating material, wherein the conductive anode structure is conductively coupled to the e-fuse body, and a conductive cathode structure that is positioned in the layer of insulating material, wherein the conductive cathode structure is conductively coupled to the e-fuse body, and wherein the first plurality of conductive contact structures, the conductive anode structure and the conductive cathode structure are all comprised of the same materials.

One illustrative integrated circuit product disclosed herein includes a transistor formed in and above an active region defined in a semiconductor substrate, the transistor including a conductive gate electrode and a plurality of source/drain regions formed in the active region, a contact level dielectric material positioned above the substrate and the source/drain regions of the transistor, a resistor body positioned on the contact level dielectric material and an e-fuse body positioned on the contact level dielectric material, wherein the resistor body and the e-fuse body are made of the same metal silicide material. In this embodiment, the product further includes at least one layer of insulating material positioned above the contact level dielectric material, the resistor body and the e-fuse body, a first plurality of conductive contact structures positioned in the layer of insulating material, wherein each of the first plurality of conductive contact structures is conductively coupled to the resistor body, a conductive anode structure positioned in the layer of insulating material, wherein the conductive anode structure is conductively coupled to the e-fuse body, a conductive cathode structure that is positioned in the layer of insulating material, wherein the conductive cathode structure is conductively coupled to the e-fuse body, a conductive source/drain contact that is conductively coupled to one of the source/drain regions and a conductive gate contact that is conductively coupled to the conductive gate electrode, wherein the first plurality of conductive contact structures, the conductive anode structure, the conductive cathode structure and at least one of the conductive source/drain contact or the conductive gate contact are all comprised of the same materials.

Also disclosed herein are various novel methods of forming an integrated circuit product that includes an e-fuse device. One illustrative method of forming an integrated circuit product includes forming a contact level dielectric material above a semiconductor substrate, depositing a layer of conductive material on the contact level dielectric material, performing a common etching process operation on the layer of conductive material so as to define a resistor body positioned on the contact level dielectric material and an e-fuse body positioned on the contact level dielectric material, wherein the resistor body and the e-fuse body are made of the layer of conductive material, forming at least one layer of insulating material above the contact level dielectric material, the resistor body and the e-fuse body and performing at least one common process operation to form a first plurality of conductive contact structures positioned in the layer of insulating material, wherein each of the first plurality of conductive contact structures is conductively coupled to the resistor body, a conductive anode structure positioned in the layer of insulating material, wherein the conductive anode structure is conductively coupled to the e-fuse body, and a conductive cathode structure that is positioned in the layer of insulating material, wherein the conductive cathode structure is conductively coupled to the e-fuse body, and wherein the first plurality of conductive contact structures, the conductive anode structure and the conductive cathode structure are all comprised of the same material.

Yet another illustrative method of forming an integrated circuit product includes forming a transistor in and above an active region defined in a semiconductor substrate, wherein the transistor includes a conductive gate electrode and a plurality of source/drain regions formed in the active region, forming a contact level dielectric material above the substrate and the source/drain regions of the transistor, depositing a layer of conductive material on the contact level dielectric material and performing a common etching process operation on the layer of conductive material so as to define a resistor body positioned on the contact level dielectric material and an e-fuse body positioned on the contact level dielectric material, wherein the resistor body and the e-fuse body are made of the layer of conductive material. In this embodiment the method also includes the steps of forming at least one layer of insulating material above the contact level dielectric material, the resistor body and the e-fuse body and performing at least one common process operation to form a first plurality of conductive contact structures positioned in the at layer of insulating material, wherein each of the first plurality of conductive contact structures are conductively coupled to the resistor body, a conductive anode structure positioned in the layer of insulating material, wherein the conductive anode structure is conductively coupled to the e-fuse body, a conductive cathode structure that is positioned in the layer of insulating material, wherein the conductive cathode structure is conductively coupled to the e-fuse body, and at least one of a conductive source/drain contact that is conductively coupled to one of the source/drain regions or a conductive gate contact that is conductively coupled to the conductive gate electrode, wherein the first plurality of conductive contact structures, the conductive anode structure, the conductive cathode structure and at least one of the conductive source/drain contact or the conductive gate contact are all comprised of the same material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of making an e-fuse for use on integrated circuit products and the resulting integrated circuit product. As will be readily apparent to those skilled in the art upon a complete reading of the present application, the various embodiments of the novel e-fuses disclosed herein may be employed on any type of integrated circuit product, including, but not limited to, logic devices, memory devices, ASICs, so-called system-on-chip products, etc. With reference to the attached figures, various illustrative embodiments of the novel devices and methods disclosed herein will now be described in more detail.

FIGS. 3A-3K depict various illustrative methods disclosed herein of making an e-fuse for use on an integrated circuit product 100 that is formed on a semiconductor substrate 102 and the resulting integrated circuit product. The substrate 102 may have a variety of configurations, such as a bulk substrate configuration, or it may be the active layer of a silicon-on-insulator (SOI) substrate. The substrate 102 may be made of silicon or it may be made of materials other than silicon. Thus, the terms "substrate" or "semiconductor substrate" should be understood to cover all semiconducting materials and all forms of such materials.

Figure 3A:
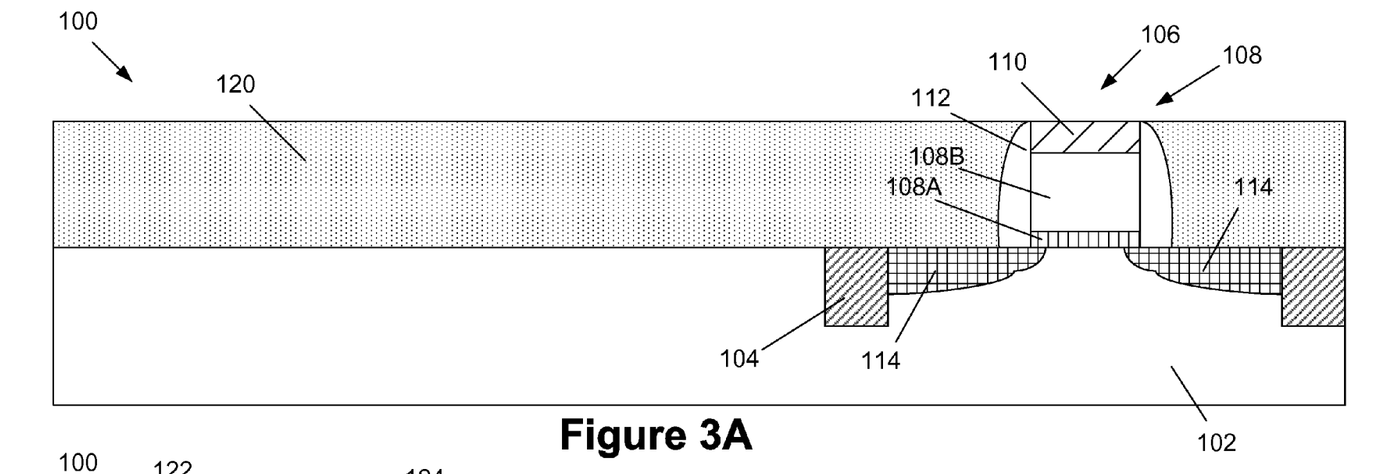
FIGS. 3A-3K depict various illustrative methods disclosed herein of making an e-fuse for use on integrated circuit products and the resulting integrated circuit product.

FIG. 3A is a cross-sectional view that schematically depicts the product 100 at a point in fabrication wherein an illustrative transistor 106 has been formed in and above an active region defined in the substrate 102 by an illustrative isolation region 104. The transistor 106 may be either an NMOS or PMOS transistor. The transistor 106 is generally comprised of a gate structure 108 comprised of a gate insulation layer 108A and a conductive gate electrode layer 108B, sidewall spacers 112, a gate cap layer 110 and source/drain regions 114. Various other aspects of the transistor 108 are not depicted, e.g., doped well regions, halo implant regions, etc.

Also depicted in FIG. 3A is a contact level dielectric material 120 that has been formed above the substrate 102. The contact level dielectric material 120 is intended to be representative in nature as it may be comprised of one or more layers of insulating material that have been formed above the product 100 prior to beginning the process of forming contact openings, etc. The contact level dielectric material 120 may be comprised of a variety of different materials, such as silicon dioxide, silicon nitride, a low-k (k value less than about 3.3) insulating material, and it may be formed by performing a variety of techniques, e.g., CVD, etc. The overall thickness of the contact level dielectric material 120 may vary depending upon the particular application. The product 100 is depicted at the point in fabrication wherein it is time to form conductive contacts to at least the source/drain regions 114 of the transistor 106.

Figure 3B:
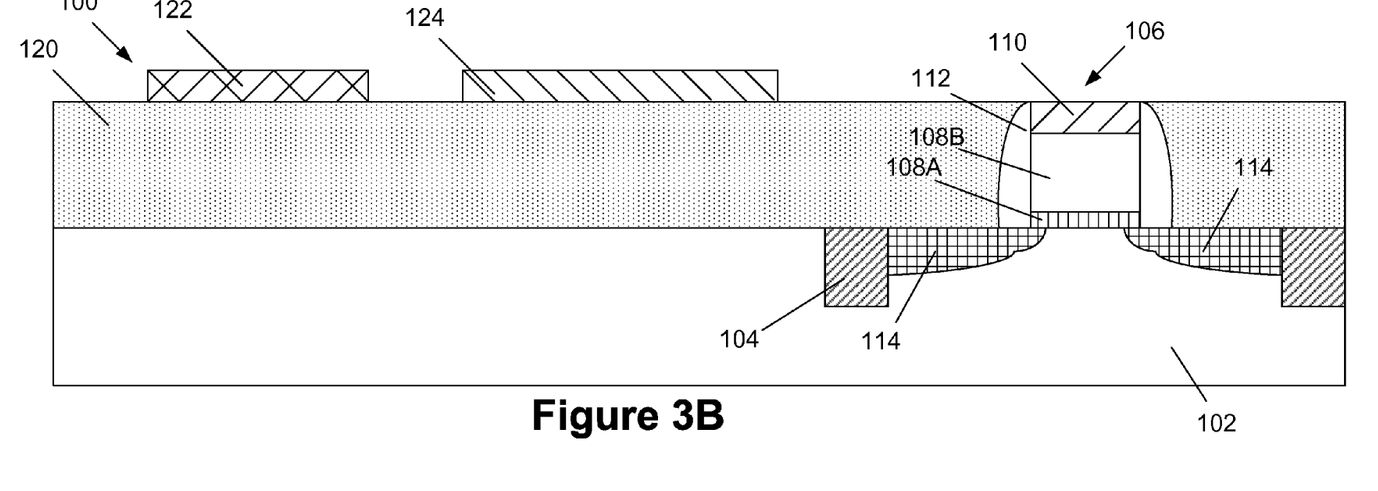
Figure 3C:
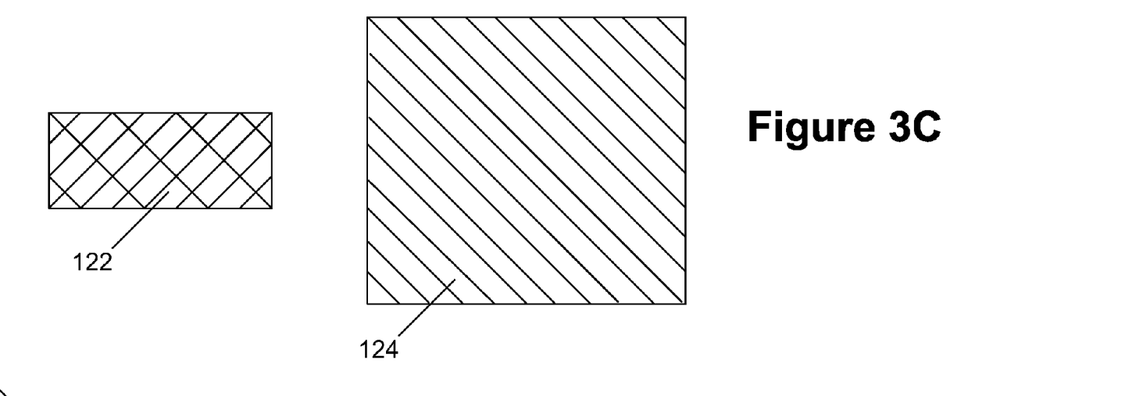

Next, as shown in FIG. 3B, a resistor body 122 and an e-fuse body 124 are formed above the contact level dielectric material 120. In one embodiment, the resistor body 122 and the e-fuse body 124 may be formed by performing several common process operations and they are made of the same material. For example, the resistor body 122 and the e-fuse body 124 may be formed by blanket-depositing a single layer of a conductive material, such as a metal silicide, e.g., tungsten silicide, titanium silicide, etc., and thereafter performing a common etching process on the deposited metal silicide layer using known photolithography and etching tools and techniques to thereby define the resistor body 122 and the e-fuse body 124. FIG. 3C is a plan view of illustrative examples of the resistor body 122 and the e-fuse body 124. Note that the depicted examples are not to scale and the resistor body 122 and the e-fuse body 124 may be of any desired size, shape, or configuration when viewed from above. The deposited layer of metal silicide material may be initially deposited by performing, for example, a PVD process. The resistor body 122 and the e-fuse body 124 may be formed to any desired thickness.

Figure 3D:
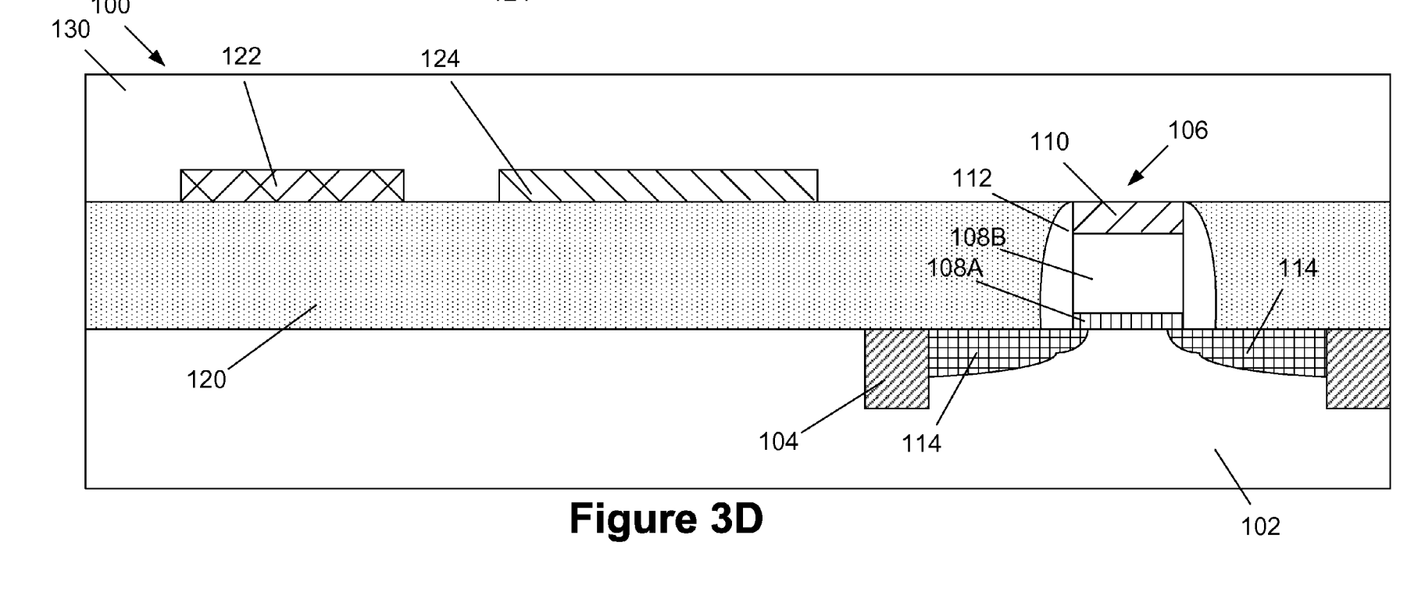

FIG. 3D depicts the product 100 after a layer of insulating material 130 is deposited above the product 100. The layer of insulating material 130 is intended to be representative in nature as it may be comprised of one or more layers of insulating material, e.g., silicon dioxide, silicon nitride, a low-k material, etc. The layer of insulating material 130 may be formed by performing one or more known deposition processes, e.g., CVD, and it may be formed to any desired thickness.

Figure 3E:
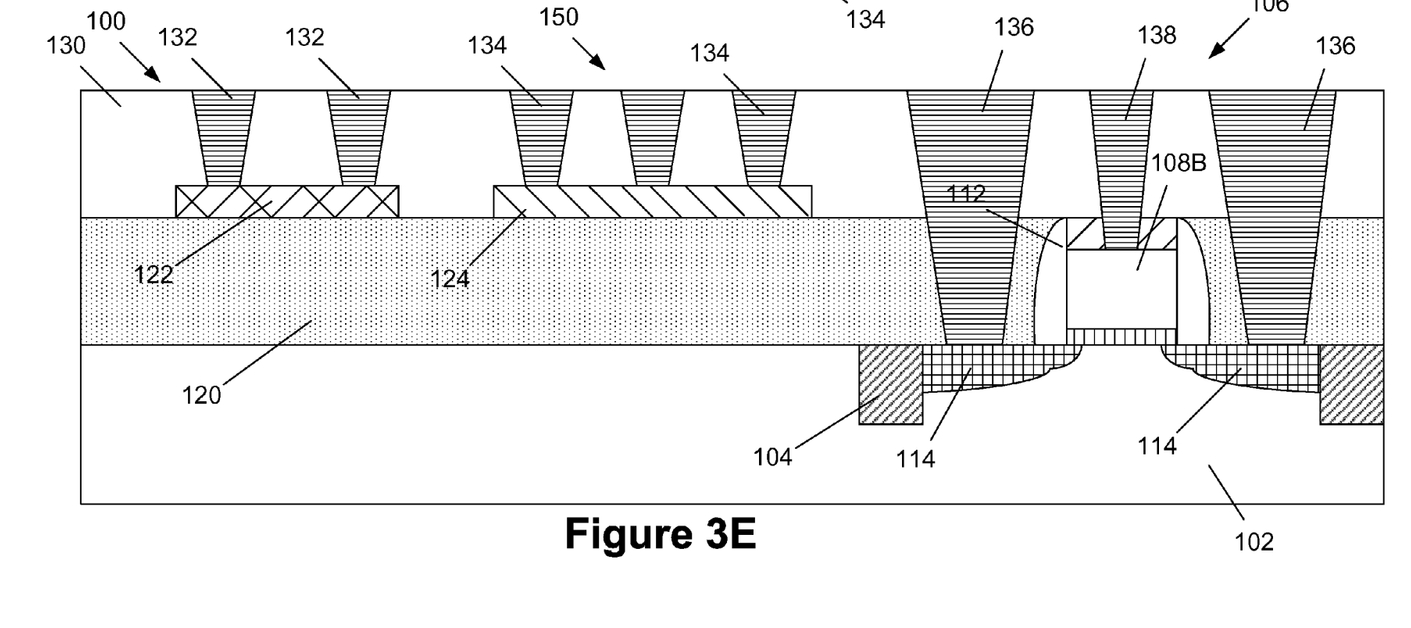
Figure 3F:
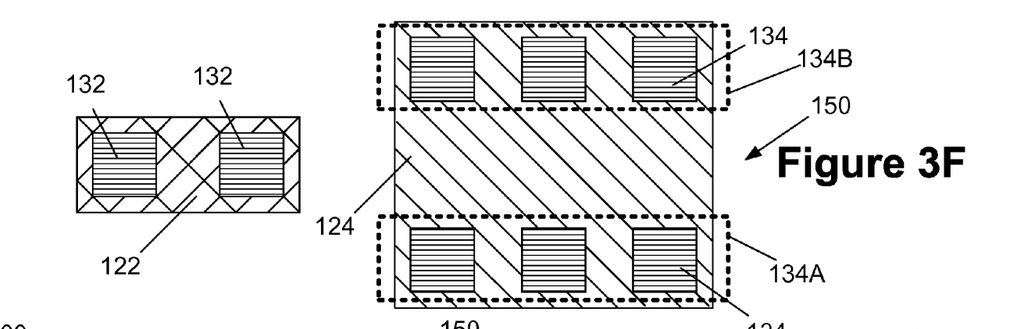

FIGS. 3E-3F depict the device 100 after various conductive contact structures have been formed to establish electrical contacts to the source/drain regions 114 of the transistor 106, the gate electrode 108B of the transistor 106, the resistor body 122 and the e-fuse body 124. More specifically, conductive contact structures 132 are formed so as to be conductively coupled to the resistor body 122, conductive contact structures 134 are formed so as to be conductively coupled to the e-fuse body 124, conductive contact structures 136 are formed so as to be conductively coupled to the source/drain regions 114 and conductive contact structure 138 is formed so as to be conductively coupled to the gate electrode 108B of the transistor 106. Although simplistically depicted in FIGS. 3E-3F, some of the various conductive contact structures 132, 134, 136 and 138 may be formed at the same time or at different times in the process flow depending upon the particular application. For example, the conductive contact structures 132, 134, 136 may all be formed at the same time, while the conductive contact structure 138 that is coupled to the gate electrode 108B may be formed at a later point in time. Additionally, the contact structures 132/134 can be formed at the same time as either the structures 136 or 138 depending upon the particular process flow chosen. Moreover, the conductive contact structures 132, 134, 136 and 138 shown in FIGS. 3E-3F are depicted as being formed of a single uniform material. In practice, the conductive contact structures 132, 134, 136 and 138 may be comprised of two or more conductive materials, e.g., a metal silicide region and a tungsten region coupled to the metal silicide region. The manner in which the conductive contact structures 132, 134, 136 and 138 are formed is well known to those skilled in the art.

In practice, the conductive contact structures 132 provide a conductive flow path for current that passes through the resistor body 122 to establish the desired resistance in the circuit that includes the resistor. The conductive contact structures 134 constitute the anode 134A and the cathode 134B of the e-fuse 150. The conductive contact structures 134 may be of any size, shape, number and configuration. For example, instead of the depicted discreet, individual contacts 134, the anode and cathode of the e-fuse 150 may be conductive line-type features. Importantly, all or a portion of the conductive contact structures 132, 134 are formed at the same time as at least a portion of one of the conductive contact structures 136 (source/drain contacts) or 138 (gate contact) are formed. That is, at least one common process operation, e.g., deposition, polishing, etc., is performed to form the conductive contact structures 132, 134 and at least a portion of one of the conductive contact structures 136 or 138. In one particular embodiment, the conductive contact structures 132 and 134 and one of the conductive contact structures 136 and 138 are comprised of the same conductive materials and they are formed by performing one or more common process operations, e.g., performing one or more metal deposition processes and performing one or more planarization processes.

Figure 3G:
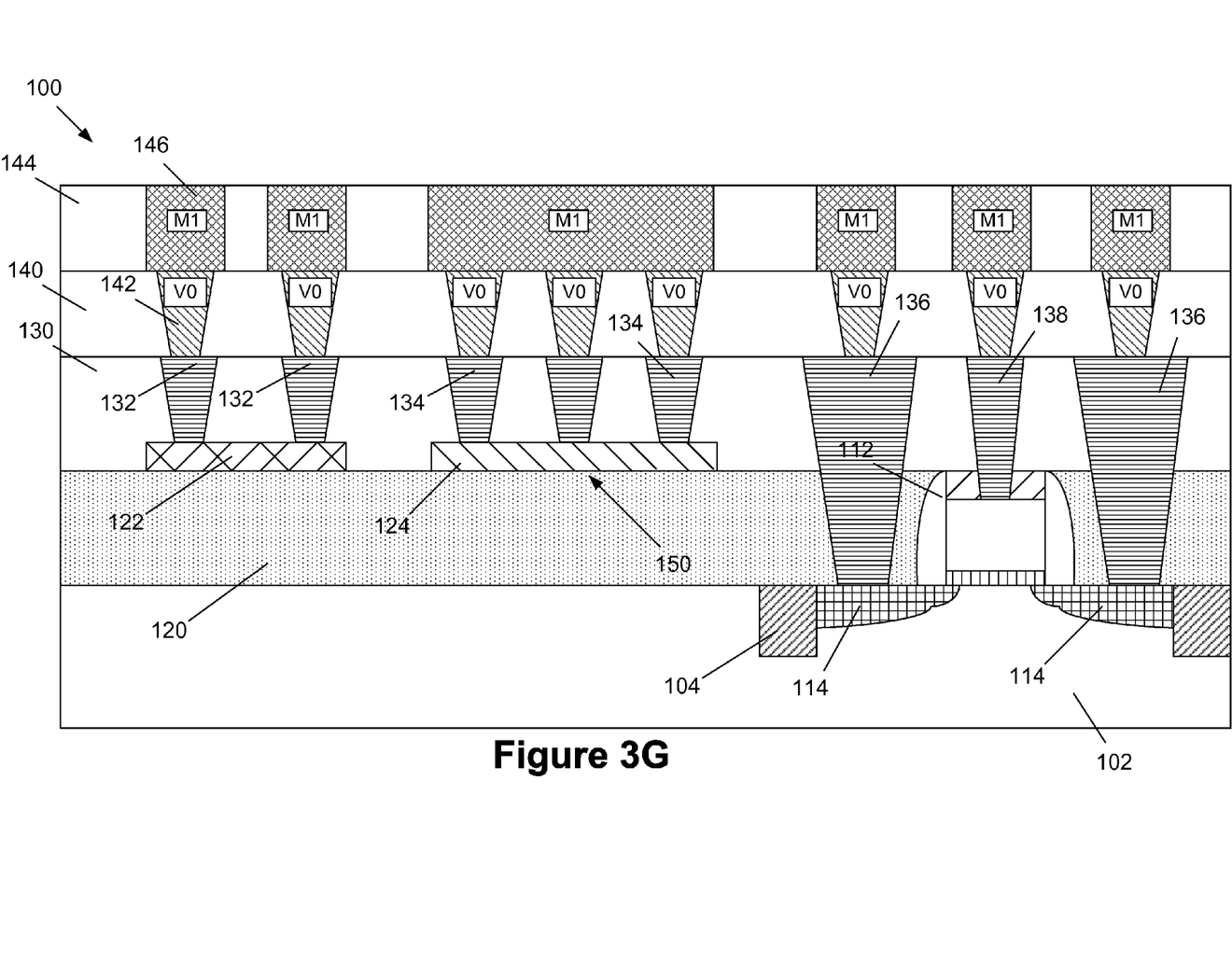

FIG. 3G depicts the product after an illustrative metallization layer is formed above the layer of insulating material 130. More specifically, a plurality of conductive vias 142 (also referred to as "V0" structures) are formed in a layer of insulating material 140, and a plurality of conductive metal lines 146 (also referred to as "M1" lines) are formed in a layer of insulating material 144. In general, the M1 level is the first major wiring level of the product 100 that establishes the means by which the various circuits formed on the product are conductively coupled together to form a functioning integrated circuit product. Typically, a modern integrated circuit product will have several metallization layers formed above the M1 metallization layer.

Figure 3H:
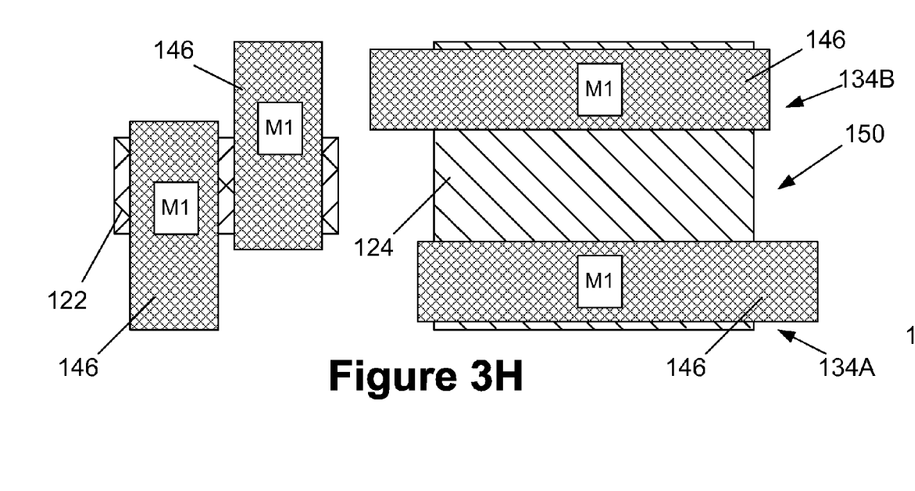
Figure 3I:
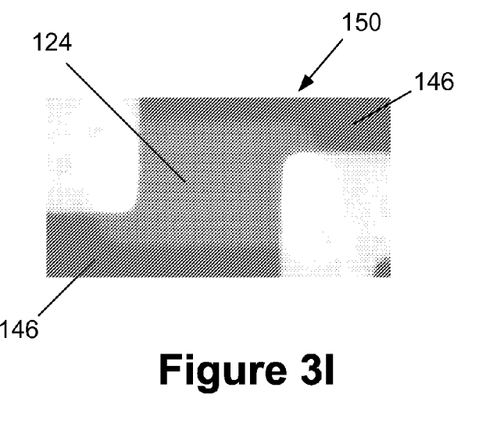

FIG. 3H is a plan view of the resistor 122, the e-fuse 150 disclosed herein and the M1 metallization layer wherein the e-fuse 150 is in a non-programmed state wherein the fuse body 124 is capable of conducting a current through the fuse body 124. That is, the fuse body 124 is not ruptured in the non-programmed state. FIG. 3I is a TEM photograph of a manufactured version of the e-fuse 150 device disclosed herein in a non-programmed state. As shown in FIGS. 3H-3I, the anode 134A and cathode 134B of the e-fuse 150 are conductively coupled to separate M1 level metal lines by the conductive vias 142 (not shown in FIG. 3H) that are positioned under the metal lines. As noted above, in the non-programmed state, the e-fuse 150 can conduct current as desired or needed for the particular application.

Figures 3J, 3K:
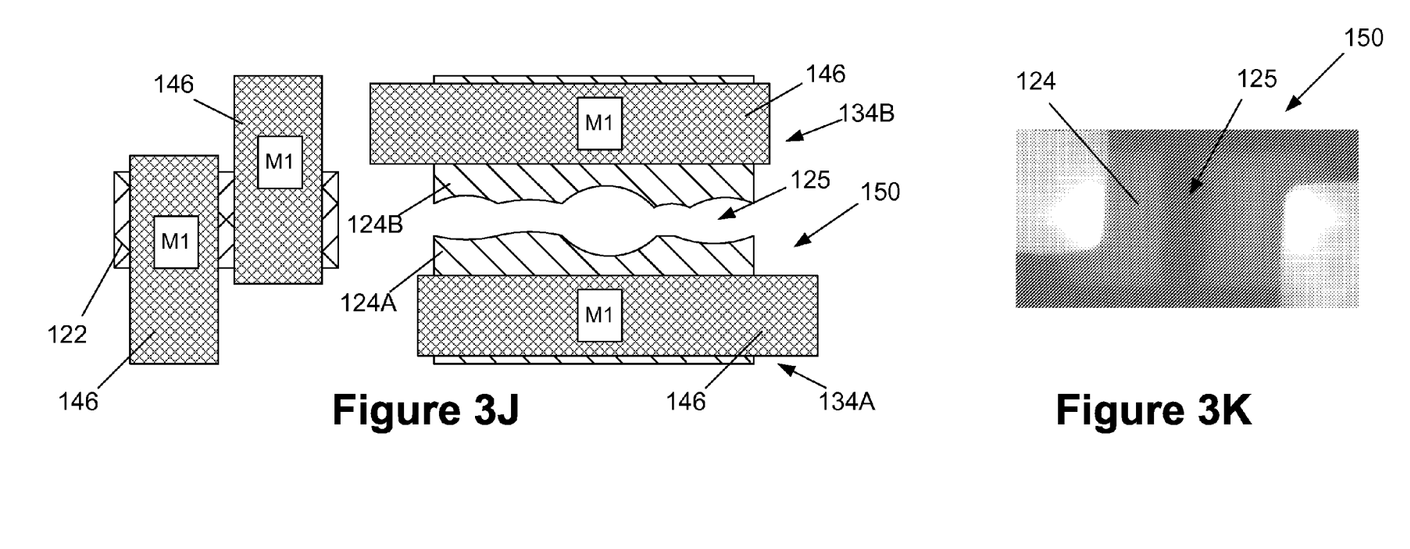

FIG. 3J is a plan view of the resistor 122, the e-fuse 150 disclosed herein and the M1 metallization layer wherein the e-fuse 150 is in a programmed state wherein the fuse body 124 is ruptured, as indicated by the arrow 125, and therefore cannot conduct a current through the fuse body 124. FIG. 3K is a TEM photograph of a manufactured version of the e-fuse 150 device disclosed herein in such a programmed state. As shown in FIGS. 3J-3K, in one embodiment, the e-fuse body 124 is sized such that when an appropriate programming current is directed to the anode or cathode, the e-fuse body 124 will rupture due to metal migration and/or resistance heating, thereby creating the desired open circuit. The extent of the rupturing of the e-fuse body 124 may vary depending upon the particular application. In this ruptured, programmed condition, the programmed state, the e-fuse 150 cannot conduct current through the ruptured fuse body 124. As noted above, the magnitude of the programming current will vary depending upon the particular application, e.g., 3-10 mA.

As will be recognized by those skilled in the art after a complete reading of the present application, the e-fuse device 150 disclosed herein provides several advantages as compared to prior art e-fuse devices and methods of making such prior art devices. For example, the illustrative e-fuse device 150 disclosed herein may be programmed with a smaller programming current as compared to, for example, some prior art BEOL e-fuses because the resistance of such BEOL e-fuses is much lower than the novel e-fuse structures disclosed herein. Accordingly, relatively higher currents were required to program the BEOL e-fuses to generate the necessary power to rupture or program such a BEOL e-fuse. Additionally, in the illustrative example where the e-fuse 150 and the resistor are formed of the same materials and by performing one or more manufacturing process operations in common, manufacturing efficiencies may be increased. Similarly, by forming the contacts 132, 134 at the same time and from the same materials as at least a portion of the contacts 136, 138, additional manufacturing efficiencies may be realized. Other advantages will be recognized by those skilled in the art after a complete reading of the present application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming an integrated circuit product, comprising:
    forming a contact level dielectric material above a semiconductor substrate;
    depositing a layer of conductive material above said contact level dielectric material after forming said contact level dielectric material;
    performing a current etching process operation on said layer of conductive material so as to define a resistor body positioned above said contact level dielectric material and an e-fuse body positioned above said contact level dielectric material, wherein said resistor body and said e-fuse body are made of said layer of conductive material;

forming at least one layer of insulating material positioned above said contact level dielectric material, said resistor body and said e-fuse body; and performing at least one concurrent process operation to form:

a first plurality of conductive contact structures positioned in said at least one layer of insulating material, each of said first plurality of conductive contact structures being conductively coupled to said resistor body;

a conductive anode structure positioned in said at least one layer of insulating material, said conductive anode structure being conductively coupled to said e-fuse body;

a conductive cathode structure positioned in said at least one layer of insulating material, said conductive cathode structure being conductively coupled to said e-fuse body; and at least one other conductive contact structure at least partially disposed in said contact level dielectric material, wherein said first plurality of conductive contact structures, said conductive anode structure, said conductive cathode structure and said at least one other contact structure are all comprised of the same material.

2. The method of claim 1, wherein forming said layer of conductive material comprises blanket-depositing a layer of a metal silicide material on said contact level dielectric material.

3. The method of claim 1, wherein performing said at least one concurrent process operation comprises:

performing at least one concurrent metal deposition process; and performing at least one planarization process.

4. A method of forming an integrated circuit product, comprising:

forming a transistor in and above an active region defined in a semiconductor substrate, said transistor comprising a conductive gate electrode and a plurality of source/drain regions formed in said active region;

forming a contact level dielectric material above said substrate and said source/drain regions of said transistor;

depositing a layer of conductive material above said contact level dielectric material after forming said contact level dielectric material;

performing a concurrent etching process operation on said layer of conductive material so as to define a resistor body positioned above said contact level dielectric material and an e-fuse body positioned above said contact level dielectric material, wherein said resistor body and said e-fuse body are made of said layer of conductive material;

forming at least one layer of insulating material above said contact level dielectric material, said resistor body and said e-fuse body; and performing at least one concurrent process operation to form:

a first plurality of conductive contact structures positioned in said at least one layer of insulating material, each of said first plurality of conductive contact structures being conductively coupled to said resistor body;

a conductive anode structure positioned in said at least one layer of insulating material, said conductive anode structure being conductively coupled to said e-fuse body;

a conductive cathode structure positioned in said at least one layer of insulating material, said conductive cathode structure being conductively coupled to said e-fuse body; and a conductive source/drain contact that is at least partially positioned in said contact level dielectric material conductively coupled to one of said source/drain regions, wherein said first plurality of conductive contact structures, said conductive anode structure, said conductive cathode structure and said conductive source/drain contact are all comprised of the same material.

5. The method of claim 4, wherein forming said layer of conductive material comprises blanket-depositing a layer of a metal silicide material on said contact level dielectric material.

6. The method of claim 4, wherein performing said at least one concurrent process operation comprises:

performing at least one concurrent metal deposition process; and performing at least one planarization process.

* * * * *

UNITED STATES PATENT AND TRADEMARK OFFICE
CERTIFICATE OF CORRECTION

| | | |
|---|---|---|
| PATENT NO. | : 8,981,492 B2 | Page 1 of 1 |
| APPLICATION NO. | : 13/928060 | |
| DATED | : March 17, 2015 | |
| INVENTOR(S) | : Kwon et al. | |

It is certified that error appears in the above-identified patent and that said Letters Patent is hereby corrected as shown below:

In the Claims

In claim 1, at column 10, line 65, delete "current" and insert therefor -- concurrent --.

Signed and Sealed this
Twenty-first Day of July, 2015

Michelle K. Lee
*Director of the United States Patent and Trademark Office*